United States Patent
Yun et al.

(10) Patent No.: US 9,793,326 B2
(45) Date of Patent: Oct. 17, 2017

(54) ORGANIC LIGHT-EMITTING DISPLAY DEVICE

(71) Applicant: Samsung Display Co. Ltd., Yongin, Gyeonggi-Do (KR)

(72) Inventors: Young Nam Yun, Suwon-si (KR); Kyu Seok Kim, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/222,187

(22) Filed: Mar. 21, 2014

(65) Prior Publication Data

US 2015/0014655 A1     Jan. 15, 2015

(30) Foreign Application Priority Data

Jul. 10, 2013    (KR) ................ 10-2013-0081043

(51) Int. Cl.
*H01L 33/00* (2010.01)
*H01L 27/32* (2006.01)
*H01L 33/50* (2010.01)

(52) U.S. Cl.
CPC .......... *H01L 27/322* (2013.01); *H01L 33/508* (2013.01)

(58) Field of Classification Search
CPC .................................................... H01L 33/508
USPC .............................................. 257/40, 89, 98
See application file for complete search history.

(56) References Cited

U.S. PATENT DOCUMENTS 8,659,723 B2 * 2/2014 Park .................. G02F 1/133514
349/106

2005/0024560 A1 * 2/2005 Yang ................. G02F 1/133514
349/114
2005/0225237 A1 * 10/2005 Winters ............. H01L 51/5265
313/506
2006/0087603 A1 * 4/2006 Lee ....................... G02B 5/201
349/109
2007/0008462 A1 * 1/2007 Yang ................. G02F 1/133514
349/106

(Continued)

FOREIGN PATENT DOCUMENTS

JP     2003-233063 A     8/2003
JP       2003233063    *  8/2003 ............... G02B 5/20

(Continued)

OTHER PUBLICATIONS

Office Action dated Feb. 12, 2015 of corresponding European patent application No. 14166953.1—7 pages.

*Primary Examiner* — Jamie C Niesz
(74) *Attorney, Agent, or Firm* — Knobbe Martens Olson & Bear LLP

(57) ABSTRACT

An organic light-emitting display device includes first through third pixels, wherein each of the first through third pixels comprises a first electrode, a second electrode which faces the first electrode, an organic light-emitting layer which is disposed between the first electrode and the second electrode. The first pixel includes a first color filter material, the second pixel includes a second color filter material, and the third pixel includes a third color filter material. The third pixel comprises a first transmitting region in which the third color filter material is not disposed and which is configured to allow a substantial amount of light emitted from the organic light-emitting layer of the third pixel to transmit therethrough.

7 Claims, 10 Drawing Sheets

(56) References Cited

U.S. PATENT DOCUMENTS

| | | | | |
|---|---|---|---|---|
| 2008/0068533 | A1* | 3/2008 | Yun | G02F 1/133514 |
| | | | | 349/68 |
| 2012/0287605 | A1* | 11/2012 | Chen | H01L 27/322 |
| | | | | 362/97.1 |
| 2013/0049640 | A1 | 2/2013 | Kuo et al. | |
| 2013/0077284 | A1* | 3/2013 | Chang | G02B 5/30 |
| | | | | 362/19 |
| 2014/0028181 | A1* | 1/2014 | Lee | H05B 33/14 |
| | | | | 313/504 |
| 2014/0252317 | A1* | 9/2014 | Gupta | H01L 51/5203 |
| | | | | 257/40 |

FOREIGN PATENT DOCUMENTS

| | | | |
|---|---|---|---|
| JP | 2004-163461 A | 6/2004 | |
| JP | WO 2011027712 * | 3/2011 | G02B 5/20 |
| JP | 4736284 B2 | 7/2011 | |
| KR | 10-2004-0083419 A | 10/2004 | |
| KR | 10-2009-0035868 A | 4/2009 | |
| KR | 10-2009-0085353 A | 8/2009 | |
| KR | 10-2011-0061914 A | 6/2011 | |
| WO | 2011/027712 A1 | 3/2011 | |

* cited by examiner

ORGANIC LIGHT-EMITTING DISPLAY DEVICE

This application claims priority from Korean Patent Application No. 10-2013-0081043 filed on Jul. 10, 2013 in the Korean Intellectual Property Office, the disclosure of which is incorporated herein by reference in its entirety.

BACKGROUND

1. Field

The present disclosure relates to an organic light-emitting display device, and more particularly, to an organic light-emitting display device including color filters.

2. Description of the Related Art

An organic light-emitting display device may include a plurality of pixels, and each of the pixels may include a first electrode, a second electrode, and an organic light-emitting layer disposed between the first electrode and the second electrode. The organic light-emitting layer may emit light at a brightness level corresponding to an electric current flowing between the first electrode and the second electrode. The organic light-emitting display device may display a desired image by controlling the electric current flowing between the first electrode and the second electrode.

The first electrodes of the pixels may be separate from each other, and a signal corresponding to a gray level of each pixel may be transmitted to each first electrode. The second electrodes of the pixels may be integrated as a common electrode, and a common signal may be transmitted to the common electrode. The first electrode, the second electrode and the organic light-emitting layer may function as a diode, the first electrode may function as an anode, and the second electrode may function as a cathode.

The organic light-emitting layer included in each of the pixels may emit light of a different color according to the type of the pixel or may emit light of the same color. In a case where the organic light-emitting layer included in each of the pixels emits light of a different color according to the type of the pixel, the organic light-emitting layer included in each of the pixels may emit light of one of red, green and blue, but the present invention is not limited thereto. In a case where the organic light-emitting layer included in each of the pixels emits light of the same color, the organic light-emitting layer may emit white light, but the present invention is not limited thereto. In the case where the organic light-emitting layer included in each of the pixels emits light of the same color, the organic light-emitting display device may further include color filters for displaying various colors. Each of the color filters may be placed on the path of light emitted from the organic light-emitting layer so as to control the color of light emitted from each of the pixels.

SUMMARY

Aspects of the present invention provide an organic light-emitting display device having improved luminance.

Aspects of the present invention also provide an organic light-emitting display device having improved luminance and a reduced reduction in chroma.

However, aspects of the present invention are not restricted to the one set forth herein. The above and other aspects of the present invention will become more apparent to one of ordinary skill in the art to which the present invention pertains by referencing the detailed description of embodiments given below.

One aspect of the present invention provides an organic light-emitting display device comprising first through third pixels, wherein each of the first through third pixels comprises a first electrode, a second electrode which faces the first electrode, an organic light-emitting layer which is disposed between the first electrode and the second electrode and one of first through third color filters which are disposed on the second electrode, wherein the first pixel comprises the first color filter, the second pixel comprises the second color filter, and the third pixel comprises the third color filter, wherein the first through third color filters comprise first through third color filter materials which transmit light of different wavelengths, respectively, and the third pixel comprises a first transmitting region in which the third color filter material is not disposed.

Another aspect of the present invention provides An organic light-emitting display device comprising first through third pixels, wherein each of the first through third pixels comprises a first electrode, a second electrode which faces the first electrode, an organic light-emitting layer which is disposed between the first electrode and the second electrode and one of first through third color filters which are disposed on the organic light-emitting layer, wherein the first pixel comprises the first color filter, the second pixel comprises the second color filter, and the third pixel comprises the third color filter, wherein the third color filter comprises a first region and a second region having higher light transmittance than the first region.

Still another aspect of the present invention provides an organic light-emitting display device comprising a plurality of first pixels, a plurality of second pixels and a plurality of third pixels, wherein each of the first through third pixels comprises a first electrode, a second electrode which faces the first electrode, an organic light-emitting layer which is disposed between the first electrode and the second electrode; and one of first through third color filters which are disposed on the organic light-emitting layer, wherein each of the first pixels comprises the first color filter, each of the second pixels comprises the second color filter, and each of the third pixels comprises the third color filter, wherein the light transmittance of the third color filter included in one of the third pixels is different from the light transmittance of the third color filter included in another third pixel which is adjacent to the one third pixel.

Yet another aspect of the invention provides an organic light-emitting display device comprising first through third pixels, wherein each of the first through third pixels comprises: a first electrode; a second electrode; and an organic light-emitting layer disposed between the first electrode and the second electrode, wherein the first pixel comprises a first color filter material disposed over the second electrode of the first pixel and configured to transmit light having a first wavelength, wherein the second pixel comprises a second color filter material disposed over the second electrode of the second pixel and configured to transmit light having a second wavelength different from the first wavelength, wherein the third pixel comprises a third color filter material disposed over the second electrode of the third pixel and configured to transmit light having a third wavelength different from the first and second wavelengths, wherein the third pixel comprises a first transmitting region in which the third color filter material is not disposed and which is configured to allow a substantial amount of light emitted from the organic light-emitting layer of the third pixel to transmit therethrough.

A further aspect of the invention provides an organic light-emitting display device comprising first through third pixels, wherein each of the first through third pixels comprises: a first electrode; a second electrode; and an organic light-emitting layer disposed between the first electrode and the second electrode, wherein the first pixel comprises a first color filter disposed over the organic light-emitting layer of the first pixel, the second pixel comprises a second color filter disposed over the organic light-emitting layer of the second pixel, and the third pixel comprises a third color filter disposed over the organic light-emitting layer of the third pixel, wherein the third color filter comprises a first region and a second region having light transmittance higher than that of the first region.

Another aspect of the invention provides an organic light-emitting display device comprising a plurality of first pixels, a plurality of second pixels and a plurality of third pixels, wherein each of the first through third pixels comprises: a first electrode; a second electrode; and an organic light-emitting layer which is disposed between the first electrode and the second electrode, wherein each of the first pixels comprises a first color filter disposed over the organic light-emitting layer thereof, each of the second pixels comprises a second color filter disposed over the organic light-emitting layer thereof, and each of the third pixels comprises a third color filter disposed over the organic light-emitting layer thereof, wherein the third color filter included in a first one of the third pixels has a light transmittance different from that of the third color filter included in a second one of third pixels which is adjacent to the first one of the third pixels.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF EMBODIMENTS

Figure 1:
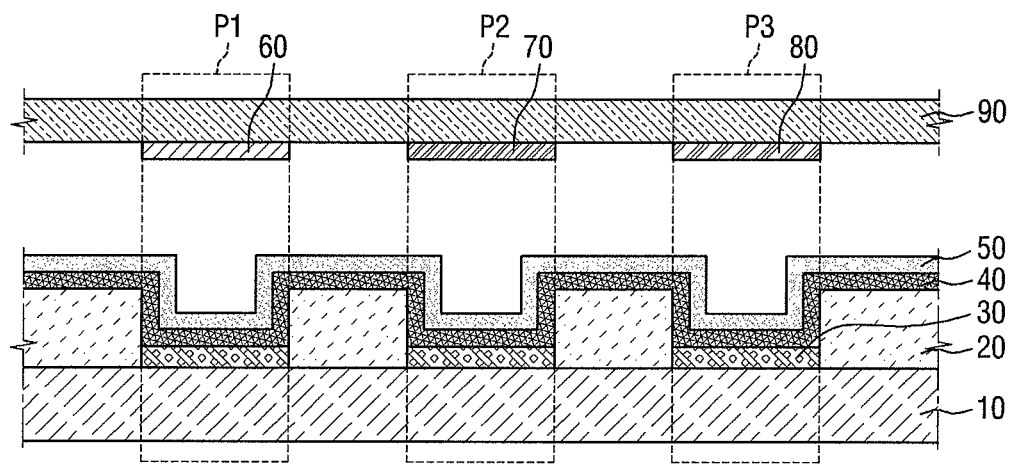
FIG. 1 is a cross-sectional view of an organic light-emitting display device according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Hereinafter, embodiments of the present invention will be described with reference to the attached drawings.

FIG. 1 is a cross-sectional view of an organic light-emitting display device 100 according to an embodiment of the present invention. Referring to FIG. 1, the organic light-emitting display device 100 includes first through third pixels P1 through P3. The first through third pixels P1 through P3 may emit light of different colors, and their emission luminance may be controlled independently. Each of the first through third pixels P1 through P3 includes a first electrode 30, an organic light-emitting layer 40, and a second electrode 50. The first pixel P1 includes a first window or color filter 60 through which light emitted from the organic light-emitting layer 40 of the first pixel P1 transmits, the second pixel P2 includes a second window or color filter 70 through which light emitted from the organic light-emitting layer 40 of the second pixel P2 transmits, and the third pixel P3 includes a third window or color filter 80 through which light emitted from the organic light-emitting layer 40 of the third pixel P3 transmits.

The first electrodes 30 respectively included in the first through third pixels P1 through P3 may be separated from each other. Although not shown in the drawing, each of the first electrodes 30 may be connected to a thin-film transistor (TFT) disposed in a first substrate 10, and the TFT may control the emission luminance of the organic light-emitting layer 40 by controlling a signal transmitted to each of the first electrodes 30. The first electrodes 30 may be formed of a reflective conductive material. In an example, the first electrodes 30 may have a structure composed of, but not limited to, silver (Ag)/indium tin oxide (ITO), ITO/Ag/ITO, molybdenum (Mo)/ITO, aluminum (Al)/ITO, or titanium (Ti)/ITO. The first electrodes 30 formed of the reflective conductive material may reflect light generated from the organic light-emitting layer 40.

The organic light-emitting layer 40 may be disposed on the first electrodes 30. The organic light-emitting layer 40 may emit light at a brightness level corresponding to an electric current flowing therethrough. The organic light-emitting layer 40 included in the first pixel P1, the organic light-emitting layer 40 included in the second pixel P2, and the organic light-emitting layer 40 included in the third pixel P3 may all emit light of the same color. In an example, the organic light-emitting layer 40 may emit white light, but the present invention is not limited thereto. The organic light-emitting layer 40 included in the first through third pixels P1 through P3 may be formed as a single layer, but the present invention is not limited thereto. In embodiments, the organic light-emitting layers 40 of the first, second and third pixels P1, P2 and P3 are connected to each other.

The second electrode 50 may be disposed on the organic light-emitting layer 40. The organic light-emitting layer 40 may be disposed between the second electrode 50 and the first electrodes 30. The second electrode 50 included in the first through third pixels P1 through P3 may be formed as a single piece, but the present invention is not limited thereto. In embodiments, the second electrodes of the first, second and third pixels P1, P2 and P3 are electrically connected to each other. The second electrode 50 may be formed of an optically transparent or semi-transparent conductive material. In an example, the second electrode 50 may be formed of, but not limited to, ITO, indium zinc oxide (IZO), a compound of magnesium (Mg) and Ag, a compound of calcium (Ca) and Ag, or a compound of lithium (Li) and Al. Light generated from the organic light-emitting layer 40 may pass through the second electrode 50.

The first, second and third windows or color filters 60, 70 and 80 may be disposed above the second electrode 50. Each of the first, second and third color filters 60, 70 and 80 may include a color filter material that transmits light of a certain wavelength among light generated from the organic light-emitting layer 40, thereby determining a color of a corresponding one of the first through third pixels P1 through P3. The color of light having a wavelength transmitted by the color filter material of each of the first, second and third color filters 60, 70 and 80 may be the color of the color filter material of each of the first, second and third color filters 60, 70 and 80. A wavelength of light transmitted by the color filter material of the first color filter 60 may be longer than a wavelength of light transmitted by the color filter material of the second color filter 70, and the wavelength of the light transmitted by the color filter material of the second color filter 70 may be longer than a wavelength of light transmitted by the color filter material of the third color filter 80. In an example, the color filter material of the first color filter 60 may be, but is not limited to, a red color filter material, the color filter material of the second color filter 70 may be, but is not limited to, a green color filter material, and the color filter material of the third color filter 80 may be, but is not limited to, a blue color filter material. In embodiments, the first, second and third color filters 60, 70 and 80 may include first through third color filter materials which transmit light of different wavelengths, respectively.

In FIG. 1, the first, second and third color filters 60, 70 and 80 are disposed above the second electrode 50. However, the present invention is not limited thereto. Although not shown in the drawing, according to some embodiments, the first, second and third color filters 60, 70 and 80 may also be disposed under the first electrodes 30. When the first, second and third color filters 60, 70 and 80 are disposed under the first electrodes 30, the first electrodes 30 may be formed of a transparent or semi-transparent conductive material, and the second electrode 50 may be formed of a reflective conductive material.

Figure 2:
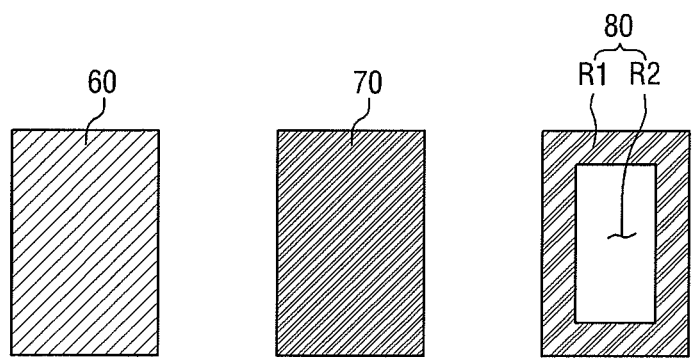
FIG. 2 is a plan view of first, second and third color filters according to an embodiment of the present invention.

The first, second and third windows or color filters 60, 70 and 80 will now be described in more detail with reference to FIG. 2. FIG. 2 is a plan view of the first, second and third color filters 60, 70 and 80 according to an embodiment of the present invention. Referring to FIG. 2, the third window or color filter 80 includes a first filter region R1 and a first transmitting region R2. The third color filter material may be disposed in the first filter region R1. Light of a certain wavelength only may transmit through the first filter region R1. In an example, light of a wavelength corresponding to blue may transmit through the first filter region R1. The luminance of light transmitting through the first filter region R1 is reduced. The third color filter material may not be disposed in the first transmitting region R2. Light in the entire visible wavelength range may transmit through the first transmitting region R2. Therefore, the luminance of light transmitting through the first transmitting region R2 is not reduced. When the third color filter 80 includes the first transmitting region R2, part of light generated from the organic light-emitting layer 40 included in the third pixel P3 may be transmitted to the outside of the organic light-emitting display device 100 through the first transmitting region R2 without color-filtering and luminance reduction. Therefore, the luminance of the organic light-emitting display device 100 can be improved. In embodiments, the first transmitting region R2 may be surrounded by the first filter region R1.

The first window or color filter 60 and the second window or color filter 70 may not include a transmitting region. In the illustrated embodiment, the first color filter material may be disposed in the entire region of the first window or color filter 60, and the second color filter material may be disposed in the entire region of the second window or color filter 70. Human perception may be more sensitive to changes in a color corresponding to a low-frequency region of light than changes in a color corresponding to a high-frequency region of light. Therefore, a reduction in chroma perceived by the human eye may be smaller when a region displaying a high-frequency color is reduced than when a region displaying a low-frequency color is reduced. Hence, the first transmitting region R2 is formed in the third color filter 80 which transmits relatively higher-frequency light than the first color filter 60 and the second color filter 70 may reduce deterioration or reduction in the chroma of the organic light-emitting display device 100. Since the organic light-emitting display device 100 according to the current embodiment includes the first color filter 60 and the second color filter 70 which do not have a transmitting region and the third color filter 80 which has the first transmitting region R2, a reduction in the chroma of the organic light-emitting display device 100 can be reduced while the luminance of the organic light-emitting display device 100 is improved.

In an example of an organic light emitting display device in which an organic light-emitting layer included in each pixel emits light of the same color, in order to increase the luminance of an organic light-emitting display device, no color filter material may be disposed in some of the pixels. In this case, the luminance of the organic light-emitting display device may be improved, but the chroma of the organic light-emitting display device may be reduced.

Referring back to FIG. 1, the organic light-emitting display device 100 may further include the first substrate 10, a pixel defining layer 20, and a second substrate 90. The first substrate 10 may be disposed under the first electrodes 30. The first substrate 10 may be plate-shaped and support other elements of the organic light-emitting display device 100. The first substrate 10 may be formed of an insulating material such as, but not limited to, glass, polyethylene terephthalate (PET), polycarbonate (PC), polyethersulfone (PES), polyimide (PI) or polymethylmethacrylate (PMMA). According to some embodiments, the first substrate 10 may also be formed of a flexible material.

The pixel defining layer 20 may be disposed on the first substrate 10. The pixel defining layer 20 may define respective regions of the first through third pixels P1 through P3. The pixel defining layer 20 may include a plurality of openings, and the respective regions of the first through third pixels P1 through P3 may be defined by the openings formed in the pixel defining layer 20.

The second substrate 90 may be disposed on the second electrode 50. The second substrate 90 may support the first, second and third color filters 60, 70 and 80. In FIG. 1, the first, second and third color filters 60, 70 and 80 are disposed on a bottom surface of the second substrate 90. However, the present invention is not limited thereto, and the first, second and third color filters 60, 70 and 80 may also be disposed on a top surface of the second substrate 90. The second substrate 90 may be formed of an optically transparent material such as, but not limited to, PET, PC, PES, PI or PMMA.

Figure 3:
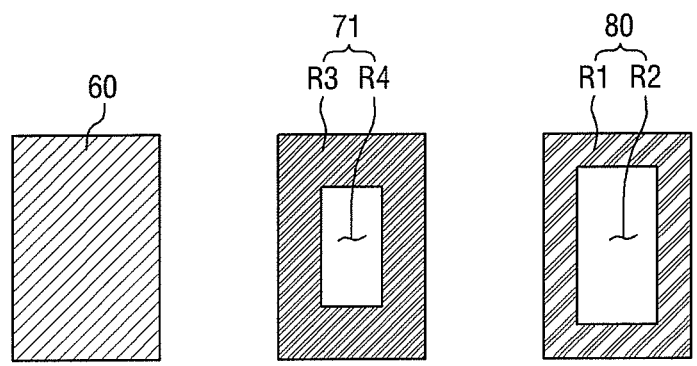
FIG. 3 is a plan view of first, second and third color filters according to another embodiment of the present invention.

Another embodiment of the present invention will now be described with reference to FIG. 3. FIG. 3 is a plan view of first, second and third windows or color filters 60, 71 and 80 according to another embodiment of the present invention. In the current embodiment of the present invention, the first, second and third color filters 60, 70 and 80 of FIG. 1 may be replaced by the first, second and third color filters 60, 71 and 80 of FIG. 3.

Referring to FIG. 3, the second window or color filter 71 may include a second filter region R3 and a second transmitting region R4. A second color filter material may be disposed in the second filter region R3. Light of a certain wavelength only may transmit through the second filter region R3. In an example, light of a wavelength corresponding to green may transmit through the second filter region R3. The luminance of light transmitting through the second filter region R3 is reduced. The second color filter material may not be disposed in the second transmitting region R4. Light in the entire visible wavelength range may transmit through the second transmitting region R4. Therefore, the luminance of light transmitting through the second transmitting region R4 may not be reduced. When the second color filter 71 includes the second transmitting region R4, part of light generated from an organic light-emitting layer 40 included in a second pixel P2 may be transmitted to the outside of an organic light-emitting display device through the second transmitting region R4 without color-filtering and luminance reduction. Therefore, the luminance of the organic light-emitting display device can be improved. In embodiments, the second transmitting region R4 may be surrounded by the second filter region R3.

The first window color filter 60 may not include a transmitting region. In the illustrated embodiment, the first color filter material may be disposed in the entire region of the first window or color filter 60. When the second transmitting region R4 and the first transmitting region R2 are formed in the second color filter 71 and the third color filter 80 which transmit relatively higher-frequency light than the first color filter 60, deterioration or reduction in the chroma of the organic light-emitting display device can be reduced while the luminance of the organic light-emitting display device is improved.

The area of the second transmitting region R4 may be smaller than that of the first transmitting region R2. When the area of the second transmitting region R4 is smaller than that of the first transmitting region R2, a reduction of the second filter region R3 due to the formation of the second transmitting region R4 may be smaller than a reduction of the first filter region R1 due to the formation of the first transmitting region R2. This can reduce a reduction in the chroma of the organic light-emitting display device while improving the luminance of the organic light-emitting display device.

A ratio of the area of the second transmitting region R4 to the area of the second window or color filter 71 may be smaller than a ratio of the area of the first transmitting region R2 to the area of the third window or color filter 80. When the ratio of the area of the second transmitting region R4 to the area of the second color filter 71 is smaller than the ratio of the area of the first transmitting region R2 to the area of the third color filter 80, the formation of the second transmitting region R4 in the second color filter 71 may result in a smaller reduction of the second filter region R3 in the second color filter 71 than a reduction of the first filter region R1 in the third color filter 80 due to the formation of the first transmitting region R2 in the their color filter 80. This can reduce a reduction in the chroma of the organic light-emitting display device while improving the luminance of the organic light-emitting display device. In embodiments, a ratio of the area of the second transmitting region R4 to the area of the second filter region R3 may be smaller than a ratio of the area of the first transmitting region R2 to the area of the first filter region R1.

Other elements are substantially the same as those of FIGS. 1 and 2 identified by the same reference characters, and thus a detailed description thereof will be omitted.

Figure 4:
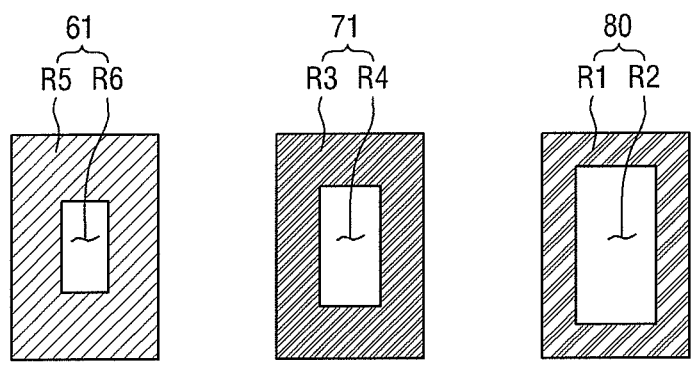
FIG. 4 is a plan view of first, second and third color filters according to another embodiment of the present invention.

Another embodiment of the present invention will now be described with reference to FIG. 4. FIG. 4 is a plan view of first, second and third windows or color filters 61, 71 and 80 according to another embodiment of the present invention. In the current embodiment of the present invention, the first, second and third color filters 60, 70 and 80 of FIG. 1 may be replaced by the first, second and third color filters 61, 71 and 80 of FIG. 4.

Referring to FIG. 4, the first window or color filter 61 may include a third filter region R5 and a third transmitting region R6. A first color filter material may be disposed in the third filter region R5. Light of a certain wavelength only may transmit through the third filter region R5. In an example, light of a wavelength corresponding to red may transmit through the third filter region R5. The luminance of light transmitting through the third filter region R5 is reduced. The first color filter material may not be disposed in the third transmitting region R6. Light in the entire visible wavelength range may transmit through the third transmitting region R6. Therefore, the luminance of light transmitting through the third transmitting region R6 may not be reduced. When the first color filter 61 includes the third transmitting region R6, part of light generated from an organic light-emitting layer 40 included in a first pixel P1 may be transmitted to the outside of an organic light-emitting display device through the third transmitting region R6 without color-filtering and luminance reduction. Therefore, the luminance of the organic light-emitting display device can be improved. The third transmitting region R6 may be surrounded by the third filter region R5.

The area of the third transmitting region R6 may be smaller than that of the second transmitting region R4. When the area of the third transmitting region R6 is smaller than that of the second transmitting region R4, a reduction of the third filter region R5 due to the formation of the third transmitting region R6 may be smaller than a reduction of the second filter region R3 due to the formation of the second transmitting region R4. This can reduce a reduction in the chroma of the organic light-emitting display device while improving the luminance of the organic light-emitting display device.

A ratio of the area of the third transmitting region R6 to the area of the first window or color filter 61 may be smaller than a ratio of the area of the second transmitting region R4 to the area of the second window or color filter 71. When the ratio of the area of the third transmitting region R6 to the area of the first color filter 61 is smaller than the ratio of the area of the second transmitting region R4 to the area of the second color filter 71, the formation of the third transmitting region R6 in the first color filter 61 may result in a smaller reduction of the third filter region R5 in the first color filter 61 than a reduction of the second filter region R3 in the second color filter 71 due to the formation of the second transmitting region R4 in the second color filter 71. This can reduce a reduction in the chroma of the organic light-emitting display device while improving the luminance of the organic light-emitting display device. In embodiments, a ratio of the area of the third transmitting region R6 to the area of the third filter region R5 may be smaller than a ratio of the area of the second transmitting region R4 to the area of the second filter region R3.

Other elements are substantially the same as those of FIGS. 1 through 3 identified by the same reference characters, and thus a detailed description thereof will be omitted.

Figure 5:
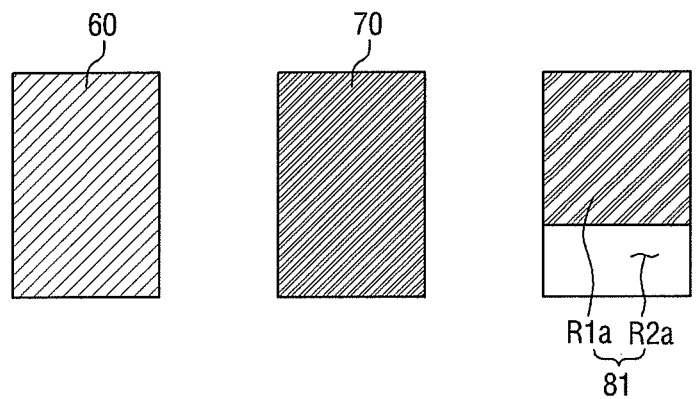
FIG. 5 is a plan view of first, second and third color filters according to another embodiment of the present invention.

Another embodiment of the present invention will now be described with reference to FIG. 5. FIG. 5 is a plan view of first, second and third windows or color filters 60, 70 and 81 according to another embodiment of the present invention. In the current embodiment of the present invention, the first, second and third windows or color filters 60, 70 and 80 of FIG. 1 may be replaced by the first, second and third color filters 60, 70 and 81 of FIG. 5.

Referring to FIG. 5, the third window or color filter 81 may include a first filter region R1a and a first transmitting region R2a. A third color filter material may be disposed in the first filter region R1a but may not be disposed in the first transmitting region R2a. The first transmitting region R2a may be disposed on the periphery of the third window or color filter 81. The first transmitting region R2a may be disposed along one side of the third window or color filter 81. When the third color filter 81 includes the first transmitting region R2a, part of light generated from an organic light-emitting layer 40 included in a third pixel P3 may be transmitted to the outside of an organic light-emitting display device through the first transmitting region R2a without color-filtering and luminance reduction. Therefore, the luminance of the organic light-emitting display device can be improved. Since the first window or color filter 60 and the second window or color filter 70 do not include a transmitting region, and the first transmitting region R2a is formed in the third window or color filter 81 which transmits relatively higher-frequency light than the first color filter 60 and the second color filter 70, a reduction in the chroma of the organic light-emitting display device can be reduced while the luminance of the organic light-emitting display device is improved.

Other elements are substantially the same as those of FIGS. 1 and 2 identified by the same reference characters, and thus a detailed description thereof will be omitted.

Figure 6:
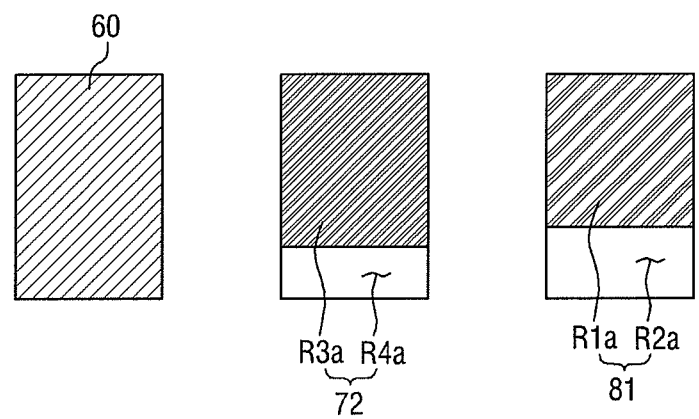
FIG. 6 is a plan view of first, second and third color filters according to another embodiment of the present invention.

Another embodiment of the present invention will now be described with reference to FIG. 6. FIG. 6 is a plan view of first, second and third color filters 60, 72 and 81 according to another embodiment of the present invention. In the current embodiment of the present invention, the first, second and third color filters 60, 70 and 80 of FIG. 1 may be replaced by the first, second and third color filters 60, 72 and 81 of FIG. 6.

Referring to FIG. 6, the second color filter 72 may include a second filter region R3a and a second transmitting region R4a. A second color filter material may be disposed in the second filter region R3a but may not be disposed in the second transmitting region R4a. The second transmitting region R4a may be disposed on the periphery of the second color filter 72. The second transmitting region R4a may be disposed along one side of the second color filter 72. When the second color filter 72 includes the second transmitting region R4a, part of light generated from an organic light-emitting layer 40 included in a second pixel P2 may be transmitted to the outside of an organic light-emitting display device through the second transmitting region R4a without color-filtering and luminance reduction. Therefore, the luminance of the organic light-emitting display device can be improved. Since the first color filter 60 does not include a transmitting region, and the second transmitting region R4a is formed in the second color filter 72 which transmits relatively higher-frequency light than the first color filter 60, a reduction in the chroma of the organic light-emitting display device can be reduced while the luminance of the organic light-emitting display device is improved.

The area of the second transmitting region R4a may be smaller than that of a first transmitting region R2a. When the area of the second transmitting region R4a is smaller than that of the first transmitting region R2a, a reduction of the second filter region R3a due to the formation of the second transmitting region R4a may be smaller than a reduction of a first filter region R1a due to the formation of the first transmitting region R2a. This can reduce a reduction in the chroma of the organic light-emitting display device while improving the luminance of the organic light-emitting display device.

A ratio of the area of the second transmitting region R4a to the area of the second color filter 72 may be smaller than a ratio of the area of the first transmitting region R2a to the area of the third color filter 81. When the ratio of the area of the second transmitting region R4a to the area of the second color filter 72 is smaller than the ratio of the area of the first transmitting region R2a to the area of the third color filter 81, the formation of the second transmitting region R4a in the second color filter 72 may result in a smaller reduction of the second filter region R3a in the second color filter 72 than a reduction of the first filter region R1a in the third color filter 81 due to the formation of the first transmitting region R2a in the third color filter 81. This can reduce a reduction in the chroma of the organic light-emitting display device while improving the luminance of the organic light-emitting display device. In embodiments, a ratio of the area of the second transmitting region R4a to the area of the second filter region R3a may be smaller than a ratio of the area of the first transmitting region R2a to the area of the first filter region R1a.

Other elements are substantially the same as those of FIGS. 1, 2 and 5 identified by the same reference characters, and thus a detailed description thereof will be omitted.

Figure 7:
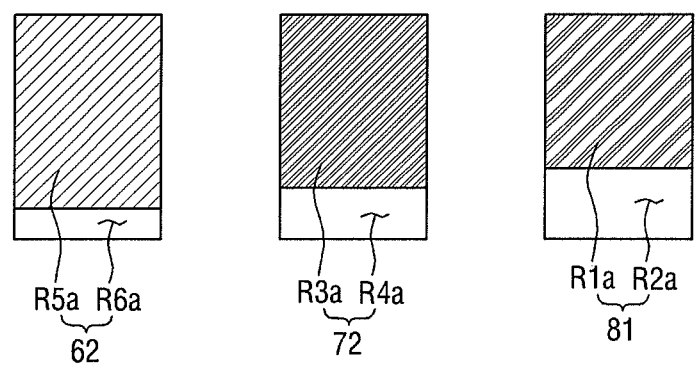
FIG. 7 is a plan view of first, second and third color filters according to another embodiment of the present invention.

Another embodiment of the present invention will now be described with reference to FIG. 7. FIG. 7 is a plan view of first, second and third color filters 62, 72 and 81 according to another embodiment of the present invention. In the current embodiment of the present invention, the first, second and third color filters 60, 70 and 80 of FIG. 1 may be replaced by the first, second and third color filters 62, 72 and 81 of FIG. 7.

Referring to FIG. 7, the first color filter 62 may include a third filter region R5a and a third transmitting region R6a. A first color filter material may be disposed in the third filter region R5a but may not be disposed in the third transmitting region R6a. The third transmitting region R6a may be disposed on the periphery of the first color filter 62. The third transmitting region R6a may be disposed along one side of the first color filter 62. When the first color filter 62 includes the third transmitting region R6a, part of light generated from an organic light-emitting layer 40 included in a first pixel P1 may be transmitted to the outside of an organic light-emitting display device through the third transmitting region R6a without color-filtering and luminance reduction. Therefore, the luminance of the organic light-emitting display device can be improved.

The area of the third transmitting region R6a may be smaller than that of a second transmitting region R4a. When the area of the third transmitting region R6a is smaller than that of the second transmitting region R4a, a reduction of the third filter region R5a due to the formation of the third transmitting region R6a may be smaller than a reduction of a second filter region R3a due to the formation of the second transmitting region R4a. This can reduce a reduction in the chroma of the organic light-emitting display device while improving the luminance of the organic light-emitting display device.

A ratio of the area of the third transmitting region R6a to the area of the first color filter 62 may be smaller than a ratio of the area of the second transmitting region R4a to the area of the second color filter 72. When the ratio of the area of the third transmitting region R6a to the area of the first color filter 62 is smaller than the ratio of the area of the second transmitting region R4a to the area of the second color filter 72, the formation of the third transmitting region R6a in the first color filter 62 may result in a smaller reduction of the third filter region R5a in the first color filter 62 than a reduction of the second filter region R3a in the second color filter 72 due to the formation of the second transmitting region R4a in the second color filter 72. This can reduce a reduction in the chroma of the organic light-emitting display device while improving the luminance of the organic light-emitting display device. In embodiments, a ratio of the area of the third transmitting region R6a to the area of the third filter region R5a may be smaller than a ratio of the area of the second transmitting region R4a to the area of the second filter region R3a.

Other elements are substantially the same as those of FIGS. 1, 2, 5 and 6 identified by the same reference characters, and thus a detailed description thereof will be omitted.

Figure 8:
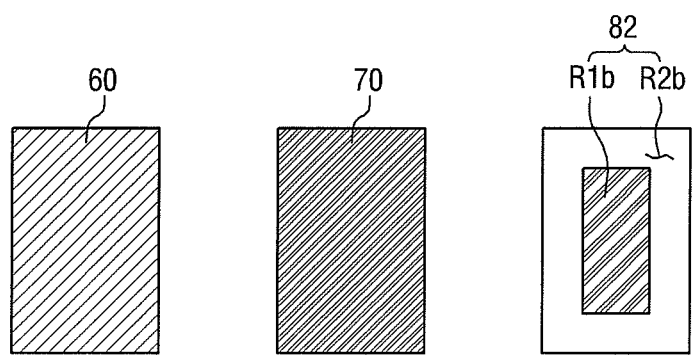
FIG. 8 is a plan view of first, second and third color filters according to another embodiment of the present invention.

Another embodiment of the present invention will now be described with reference to FIG. 8. FIG. 8 is a plan view of first, second and third color filters 60, 70 and 82 according to another embodiment of the present invention. In the current embodiment of the present invention, the first, second and third color filters 60, 70 and 80 of FIG. 1 may be replaced by the first, second and third color filters 60, 70 and 82 of FIG. 8.

Referring to FIG. 8, the third color filter 82 may include a first filter region R1b and a first transmitting region R2b. A third color filter material may be disposed in the first filter region R1b but may not be disposed in the first transmitting region R2b. The first transmitting region R2b may be disposed on the periphery of the third color filter 82. The first transmitting region R2b may surround the first filter region R1b. When the third color filter 82 includes the first transmitting region R2b, part of light generated from an organic light-emitting layer 40 included in the third pixel P3 may be transmitted to the outside of an organic light-emitting display device through the first transmitting region R2b without color-filtering and luminance reduction. Therefore, the luminance of the organic light-emitting display device can be improved. Since the first color filter 60 and the second color filter 70 do not include a transmitting region, and the first transmitting region R2b is formed in the third color filter 82 which transmits relatively higher-frequency light than the first color filter 60 and the second color filter 70, a reduction in the chroma of the organic light-emitting display device can be reduced while the luminance of the organic light-emitting display device is improved.

Other elements are substantially the same as those of FIGS. 1 and 2 identified by the same reference characters, and thus a detailed description thereof will be omitted.

Figure 9:
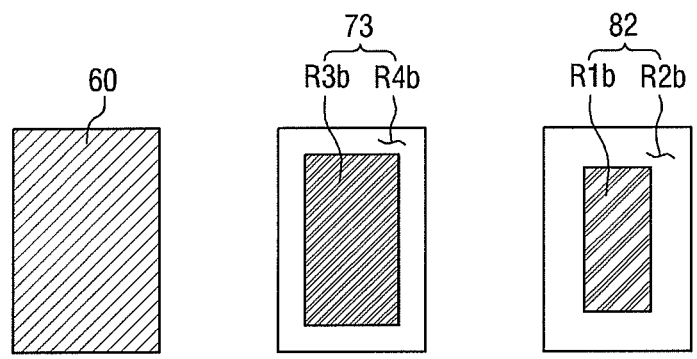
FIG. 9 is a plan view of first, second and third color filters according to another embodiment of the present invention.

Another embodiment of the present invention will now be described with reference to FIG. 9. FIG. 9 is a plan view of first, second and third color filters 60, 73 and 82 according to another embodiment of the present invention. In the current embodiment of the present invention, the first, second and third color filters 60, 70 and 80 of FIG. 1 may be replaced by the first, second and third color filters 60, 73 and 82 of FIG. 9.

Referring to FIG. 9, the second color filter 73 may include a second filter region R3b and a second transmitting region R4b. A second color filter material may be disposed in the second filter region R3b but may not be disposed in the second transmitting region R4b. The second transmitting region R4b may be disposed on the periphery of the second color filter 73. The second transmitting region R4b may surround the second filter region R3b. When the second color filter 73 includes the second transmitting region R4b, part of light generated from an organic light-emitting layer 40 included in a second pixel P2 may be transmitted to the outside of an organic light-emitting display device through the second transmitting region R4b. Therefore, the luminance of the organic light-emitting display device can be improved without color-filtering and luminance reduction. Since the first color filter 60 does not include a transmitting region, when the second transmitting region R4b is formed in the second color filter 73 which transmits relatively higher-frequency light than the first color filter 60, a reduction in the chroma of the organic light-emitting display device can be reduced while the luminance of the organic light-emitting display device is improved.

The area of the second transmitting region R4b may be smaller than that of a first transmitting region R2b. When the area of the second transmitting region R4b is smaller than that of the first transmitting region R2b, a reduction of the second filter region R3b due to the formation of the second transmitting region R4b may be smaller than a reduction of a first filter region R1b due to the formation of the first transmitting region R2b. This can reduce a reduction in the chroma of the organic light-emitting display device while improving the luminance of the organic light-emitting display device.

A ratio of the area of the second transmitting region R4b to the area of the second color filter 73 may be smaller than a ratio of the area of the first transmitting region R2b to the area of the third color filter 82. When the ratio of the area of the second transmitting region R4b to the area of the second color filter 73 is smaller than the ratio of the area of the first transmitting region R2b to the area of the third color filter 82, the formation of the second transmitting region R4b in the second color filter 73 may result in a smaller reduction of the second filter region R3b in the second color filter 73 than a reduction of the first filter region R1b in the third color filter 82 due to the formation of the first transmitting region R2b in the third color filter 82. This can reduce a reduction in the chroma of the organic light-emitting display device while improving the luminance of the organic light-emitting display device. In embodiments, a ratio of the area of the second transmitting region R4b to the area of the second filter region R3b may be smaller than a ratio of the area of the first transmitting region R2b to the area of the first filter region R1b.

Other elements are substantially the same as those of FIGS. 1, 2 and 8 identified by the same reference characters, and thus a detailed description thereof will be omitted.

Figure 10:
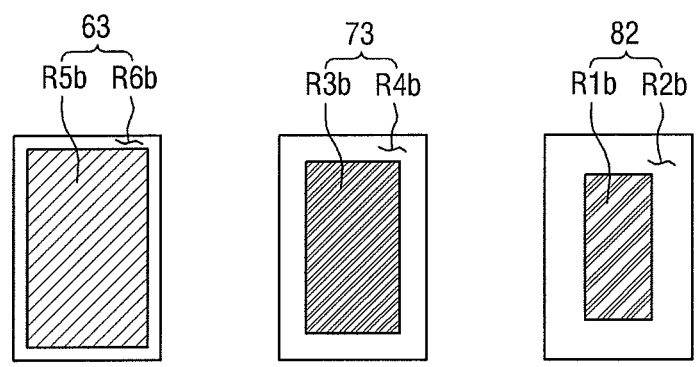
FIG. 10 is a plan view of first, second and third color filters according to another embodiment of the present invention.

Another embodiment of the present invention will now be described with reference to FIG. 10. FIG. 10 is a plan view of first, second and third color filters 63, 73 and 82 according to another embodiment of the present invention. In the current embodiment of the present invention, the first, second and third color filters 60, 70 and 80 of FIG. 1 may be replaced by the first, second and third color filters 63, 73 and 82 of FIG. 10.

Referring to FIG. 10, the first color filter 63 may include a third filter region R5b and a third transmitting region R6b. A first color filter material may be disposed in the third filter region R5b but may not be disposed in the third transmitting region R6b. The third transmitting region R6b may be disposed on the periphery of the first color filter 63. The third transmitting region R6b may surround the third filter region R5b. When the first color filter 63 includes the third transmitting region R6b, part of light generated from an organic light-emitting layer 40 included in a first pixel P1 may be transmitted to the outside of an organic light-emitting display device through the third transmitting region R6b without color-filtering and luminance reduction. Therefore, the luminance of the organic light-emitting display device can be improved.

The area of the third transmitting region R6b may be smaller than that of a second transmitting region R4b. When the area of the third transmitting region R6b is smaller than that of the second transmitting region R4b, a reduction of the third filter region R5b due to the formation of the third transmitting region R6b may be smaller than a reduction of a second filter region R3b due to the formation of the second transmitting region R4b. This can reduce a reduction in the chroma of the organic light-emitting display device while improving the luminance of the organic light-emitting display device.

A ratio of the area of the third transmitting region R6b to the area of the first color filter 63 may be smaller than a ratio of the area of the second transmitting region R4b to the area of the second color filter 73. When the ratio of the area of the third transmitting region R6b to the area of the first color filter 63 is smaller than the ratio of the area of the second transmitting region R4b to the area of the second color filter 73, the formation of the third transmitting region R6b in the first color filter 63 may result in a smaller reduction of the third filter region R5b in the first color filter 63 than a reduction of the second filter region R3b in the second color filter 73 due to the formation of the second transmitting region R4b in the second color filter 73. This can reduce a reduction in the chroma of the organic light-emitting display device while improving the luminance of the organic light-emitting display device. In embodiments, a ratio of the area of the third transmitting region R6b to the area of the third filter region R5b may be smaller than a ratio of the area of the second transmitting region R4b to the area of the second filter region R3b.

Other elements are substantially the same as those of FIGS. 1, 2, 8 and 9 identified by the same reference characters, and thus a detailed description thereof will be omitted.

Although not shown in the drawings, according to some embodiments, respective shapes of first, second and third color filters may be a combination of the shapes illustrated in FIGS. 2 through 10. In an example, the third color filter may be shaped like the third color filter 80 of FIG. 2, the second color filter may be shaped like the second color filter 72 of FIG. 6, and the first color filter may be shaped like the first color filter 63 of FIG. 10. In this way, various shapes can be combined.

Figure 11:
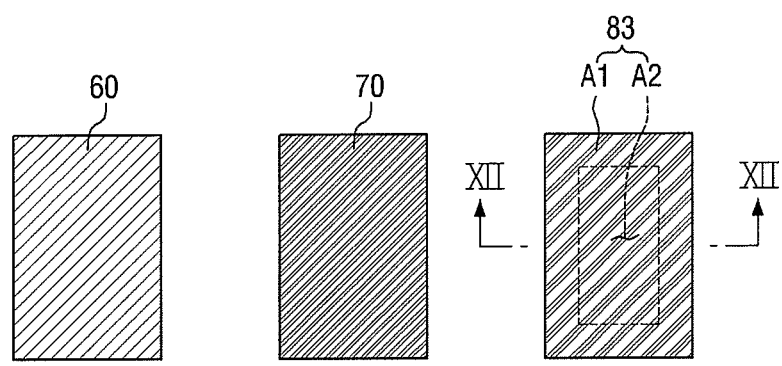
FIG. 11 is a plan view of first, second and third color filters according to another embodiment of the present invention.
Figure 12:
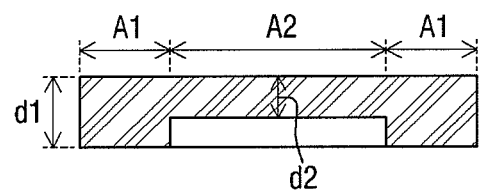
FIG. 12 is a cross-sectional view of a third color filter taken along the line XII-XII of FIG. 11.

Another embodiment of the present invention will now be described with reference to FIGS. 11 and 12. FIG. 11 is a plan view of first, second and third color filters 60, 70 and 83 according to another embodiment of the present invention. FIG. 12 is a cross-sectional view of the third color filter 83 taken along the line XII-XII of FIG. 11. In the current embodiment of the present invention, the first, second and third color filters 60, 70 and 80 of FIG. 1 may be replaced by the first, second and third color filters 60, 70 and 83 of FIG. 11.

Referring to FIG. 11, the third color filter 83 may include a first region A1 and a second region A2. A third color filter material may be disposed in the first region A1 and the second region A2. The second region A2 may have higher light transmittance than the first region A1. Referring to FIG. 12, a thickness d1 of the first region A1 may be smaller than a thickness d2 of the second region A2. Accordingly, the light transmittance of the second region A2 may be higher than that of the first region A1. When the third color filter 83 includes the second region A2 having a relatively high light transmittance, part of light generated from an organic light-emitting layer 40 included in a third pixel P3 and transmitted to the outside of an organic light-emitting display device through the second region A2 may have luminance greater than that of the color-filtered light transmitted through the first region A1. Therefore, the luminance of the organic light-emitting display device can be improved. Each of the first color filter 60 and the second color filter 70 may be formed to have a uniform thickness. Therefore, when the second region A2 is formed in the third color filter 83 which transmits relatively higher-frequency light than the first color filter 60 and the second color filter 70, a reduction in the chroma of the organic light-emitting display device can be reduced while the luminance of the organic light-emitting display device is improved. Referring back to FIG. 11, the first region A1 may surround the second region A2. However, the present invention is not limited thereto. In an example, the second region A2 may be formed along one side of the third color filter 83 or may surround the first region A1.

Other elements are substantially the same as those of FIGS. 1 and 2 identified by the same reference characters, and thus a detailed description thereof will be omitted.

Figure 13:
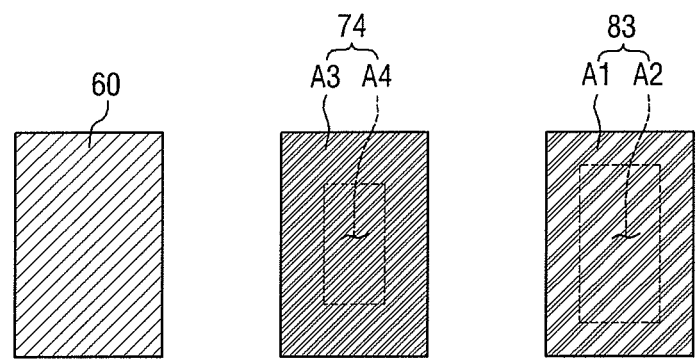
FIG. 13 is a plan view of first, second and third color filters according to another embodiment of the present invention.

Another embodiment of the present invention will now be described with reference to FIG. 13. FIG. 13 is a plan view of first, second and third color filters 60, 74 and 83 according to another embodiment of the present invention. In the current embodiment of the present invention, the first, second and third color filters 60, 70 and 80 of FIG. 1 may be replaced by the first, second and third color filters 60, 74 and 83 of FIG. 13.

Referring to FIG. 13, the second color filter 74 may include a third region A3 and a fourth region A4. The fourth region A4 may have higher light transmittance than the third region A3. Like the relationship between a thickness d1 of a first region A1 and a thickness d2 of a second region A2, a thickness of the third region A3 may be greater than a thickness of the fourth region A4. When the second color filter 74 includes the fourth region A4 having a relatively high light transmittance, part of light generated from an organic light-emitting layer 40 included in a second pixel P2 and transmitted to the outside of an organic light-emitting display device through the fourth region A4 may have luminance greater than that of the color-filtered light transmitted through the third region A3. Therefore, the luminance of the organic light-emitting display device can be improved. The first color filter 60 may be formed to have a uniform thickness. Therefore, when the fourth region A4 is formed in the second color filter 74 which transmits relatively higher-frequency light than the first color filter 60, a reduction in the chroma of the organic light-emitting display device can be reduced while the luminance of the organic light-emitting display device is improved.

The area of the fourth region A4 may be smaller than that of the second region A2. When the area of the fourth region A4 is smaller than that of the second region A2, a change in the color of the second filter 74 due to the formation of the fourth region A4 may be smaller than a change in the color of the third color filter 83 due to the formation of the second region A2. Accordingly, a change in the chroma of the second pixel P2 which can be perceived more sensitively is smaller than a change in the chroma of a third pixel P3. This can reduce a reduction in the chroma of the organic light-emitting display device while improving the luminance of the organic light-emitting display device.

A ratio of the area of the fourth region A4 to the area of the second color filter 74 may be smaller than a ratio of the area of the second region A2 to the area of the third color filter 83. When the ratio of the area of the fourth region A4 to the area of the second color filter 74 is smaller than the ratio of the area of the second region A2 to the area of the third color filter 83, even if the light transmittance of a region of the second color filter 74 is higher than that of the other region, a reduction in the chroma of the organic light-emitting display device can be reduced while the luminance of the organic light-emitting display device is improved. This is because the proportion of a region where a color change occurs in the second color filter 74 is smaller than the proportion of a region where a color change occurs in the third color filter 83.

Other elements are substantially the same as those of FIGS. 1, 2 and 11 identified by the same reference characters, and thus a detailed description thereof will be omitted.

Figure 14:
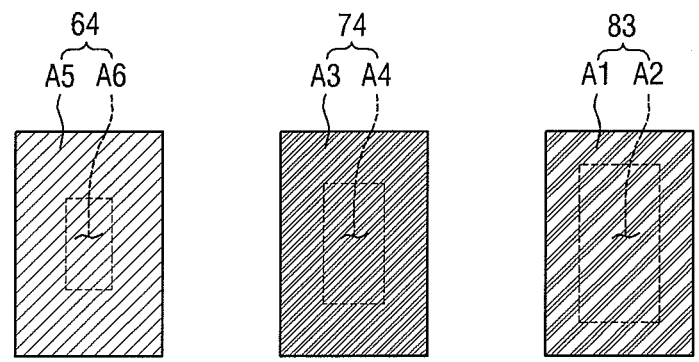
FIG. 14 is a plan view of first, second and third color filters according to another embodiment of the present invention.

Another embodiment of the present invention will now be described with reference to FIG. 14. FIG. 14 is a plan view of first, second and third color filters 64, 74 and 83 according to another embodiment of the present invention. In the current embodiment of the present invention, the first, second and third color filters 60, 70 and 80 of FIG. 1 may be replaced by the first, second and third color filters 64, 74 and 83 of FIG. 14.

Referring to FIG. 14, the first color filter 64 may include a fifth region A5 and a sixth region A6. The sixth region A6 may have higher light transmittance than the fifth region A5. Like the relationship between a thickness d1 of a first region A1 and a thickness d2 of a second region A2, a thickness of the fifth region A5 may be greater than a thickness of the sixth region A6. When the first color filter 64 includes the sixth region A6 having a relatively high light transmittance, part of light generated from an organic light-emitting layer 40 included in a first pixel P1 and transmitted to the outside of an organic light-emitting display device through the sixth region A6 may have luminance greater than that of the color-filtered light transmitted through the fifth region A5. Therefore, the luminance of the organic light-emitting display device can be improved.

The area of the sixth region A6 may be smaller than that of a fourth region A4. When the area of the sixth region A6 is smaller than that of the fourth region A4, a change in the color of the first filter 64 due to the formation of the sixth region A6 may be smaller than a change in the color of the second color filter 74 due to the formation of the fourth region A4. Accordingly, a change in the chroma of the first pixel P1 which can be perceived more sensitively is smaller than a change in the chroma of a second pixel P2. This can reduce a reduction in the chroma of the organic light-emitting display device while improving the luminance of the organic light-emitting display device.

A ratio of the area of the sixth region A6 to the area of the first color filter 64 may be smaller than a ratio of the area of the fourth region A4 to the area of the second color filter 74. When the ratio of the area of the sixth region A6 to the area of the first color filter 64 is smaller than the ratio of the area of the fourth region A4 to the area of the second color filter 74, even if the light transmittance of a region of the first color filter 64 is higher than that of the other region, a reduction in the chroma of the organic light-emitting display device can be reduced while the luminance of the organic light-emitting display device is improved. This is because the proportion of a region where a color change occurs in the first color filter 64 is smaller than the proportion of a region where a color change occurs in the second color filter 74.

Other elements are substantially the same as those of FIGS. 1, 2, 11 and 12 identified by the same reference characters, and thus a detailed description thereof will be omitted.

Figure 15:
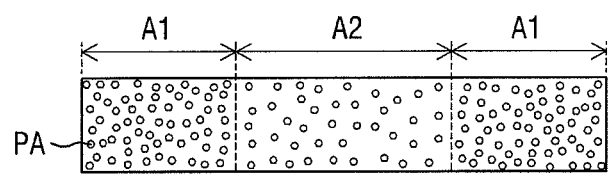
FIG. 15 is a cross-sectional view of a third color filter according to another embodiment of the present invention.

Another embodiment of the present invention will now be described with reference to FIG. 15. FIG. 15 is a cross-sectional view of a third color filter 84 according to another embodiment of the present invention. A plan view of the third color filter 84 of FIG. 15 may be substantially identical to the plan view of the third color filter 83 of FIG. 11. FIG.

15 may be a cross-sectional view of the third color filter 84 taken along substantially the same line as the line XII-XII of FIG. 11.

Referring to FIG. 15, the third color filter 84 may include a plurality of light-absorbing particles PA. The light-absorbing particles PA may absorb light of certain wavelengths. In embodiments, the light-absorbing particles PA included in the third color filter 84 may absorb red and green light and does not absorb blue light. The light-absorbing particles PA may be distributed inside the third color filter 84. The density of the light-absorbing particles PA in a first region A1 may be higher than the density of the light-absorbing particles PA in a second region A2. When the density of the light-absorbing particles PA in the first region A1 is higher than the density of the light-absorbing particles PA in the second region A2, the light transmittance of the second region A2 may be higher than the light transmittance of the first region A1. The third color filter 84 of FIG. 15 can replace the third color filters 83 of FIGS. 11, 13 and 14.

Although not shown in the drawing, according to some embodiments, a first color filter and a second color filter, like the third color filter 84, may include a plurality of light-absorbing particles. The light-absorbing particles included in the first color filter may absorb blue and green light, and does not absorb red light. The light-absorbing particles included in the second color filter may absorb red and blue light, and does not absorb green light. In embodiments, the light-absorbing particles may be distributed non-uniformly in the first color filter and the second color filter. In an example, the density of the light-absorbing particles in a third region A3 may be higher than the density of the light-absorbing particles in a fourth region A4, and the density of the light-absorbing particles in a fifth region A5 may be higher than the density of the light-absorbing particles in a sixth region A6.

Figure 16:
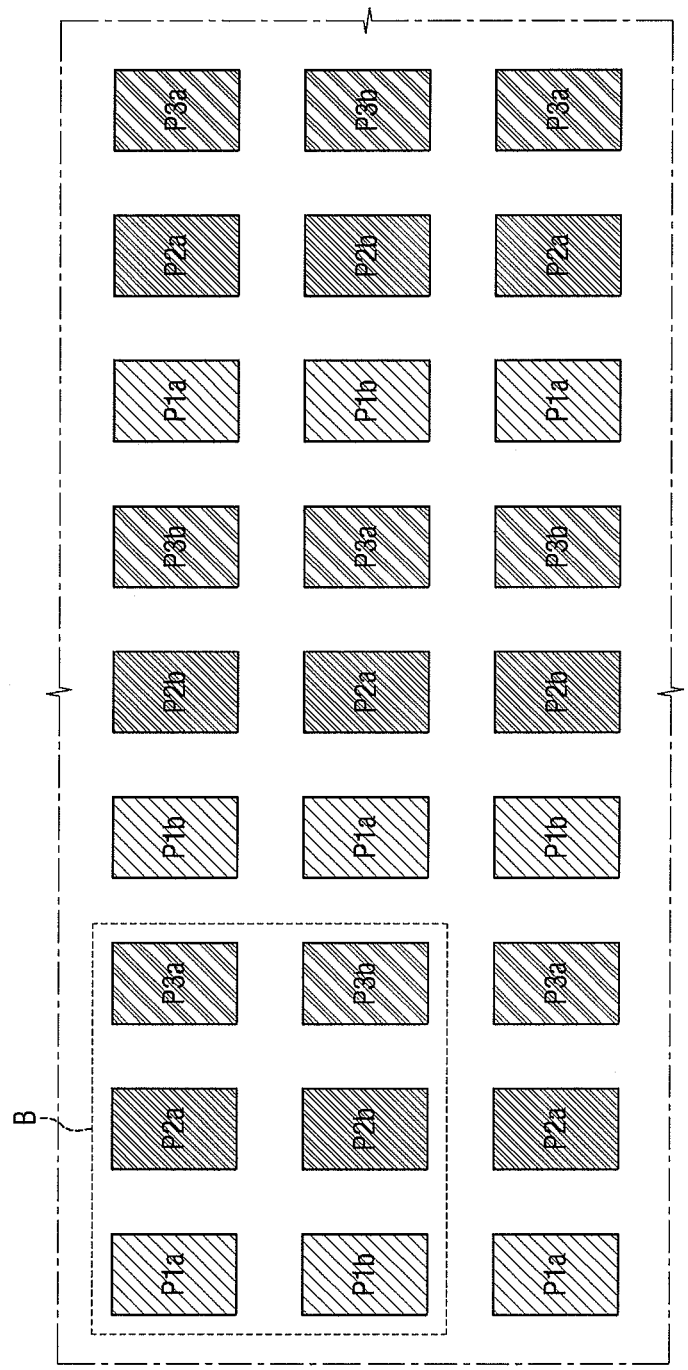
FIG. 16 is a plan view of an organic light-emitting display device according to another embodiment of the present invention.
Figure 17:
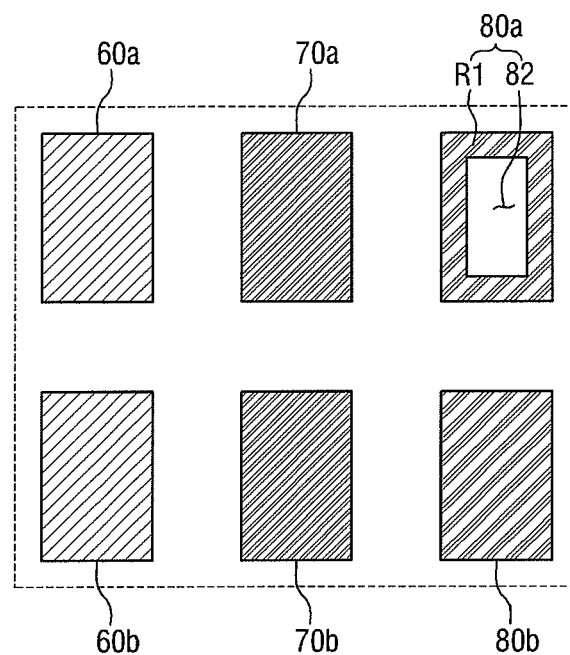
FIG. 17 is a plan view of first, second and third color filters disposed in a region B of FIG. 16.

Another embodiment of the present invention will now be described with reference to FIGS. 16 and 17. FIG. 16 is a plan view of an organic light-emitting display device 101 according to another embodiment of the present invention. FIG. 17 is a plan view of first, second and third color filters P1a, P1b, P2a, P2b, P3a and P3b disposed in a region B of FIG. 16.

Referring to FIG. 16, the organic light-emitting display device 101 may include a plurality of first pixels P1a and P1b, a plurality of second pixels P2a and P2b, and a plurality of third pixels P3a and P3b. The first, second and third pixels P1a, P1b, P2a, P2b, P3a and P3b may be divided into a plurality of first groups G1 and a plurality of second groups G2. Each of the first groups G1 may include the first, second and third pixels P1a, P2a and P3a which are adjacent to each other, and each of the second groups G2 may include the first, second and third pixels P1b, P2b and P3b which are adjacent to each other. Each of the first and second groups G1 and G2 may function as a unit for displaying one color. The first groups G1 and the second groups G2 may be alternately arranged along row and column directions.

Referring to FIGS. 16 and 17, the first, second and third pixels P1a, P2a and P3a included in each of the first groups G1 may include first, second and third color filters 60a, 70a and 80a, respectively. The first, second and third color filters 60a, 70a and 80a may be substantially identical to the first, second and third color filters 60, 70 and 80 of FIGS. 1 and 2. The first, second and third pixels P1b, P2b and P3b included in each of the second groups G2 may include first, second and third color filters 60b, 70b and 80b, respectively. Each of the first, second and third color filters 60b, 70b and 80b may have uniform light transmittance. The light transmittance of the third color filter 80b included in the third pixel P3b of each of the second groups G2 may be substantially equal to the light transmittance of a first filter region R1 of the third color filter 80a included in the third pixel P3a of each of the first groups G1. The light transmittance of the third color filter 80a included in the third pixel P3a of each of the first groups G1 may be higher than the light transmittance of the third color filter 80b included in the third pixel P3b which is adjacent to the third pixel P3a. That is, the organic light-emitting display device 101 can improve its luminance by increasing the light transmittances of color filters included in some pixels. Furthermore, the organic light-emitting display device 101 can reduce a reduction in chroma by maintaining the light transmittances of color filters included in some pixels at moderate levels.

According to some embodiments, the first, second and third color filters 60a, 70a and 80a included in the first, second and third pixels P1, P2 and P3 of each of the first groups G1 can be replaced by the first, second and third color filters described above with reference to FIGS. 3 through 15.

Embodiments of the present invention provide at least one of the following advantages. The luminance of an organic light-emitting display device can be improved. In addition, it is possible to reduce a reduction in the chroma of the organic light-emitting display device while improving the luminance of the organic light-emitting display device.

However, the effects of the present invention are not restricted to the one set forth herein. The above and other effects of the present invention will become more apparent to one of daily skill in the art to which the present invention pertains by referencing the claims.

What is claimed is:

1. An organic light-emitting display device comprising:
   a substrate comprising a major surface;
   a pixel defining layer formed on the substrate;
   first, second and third pixels, wherein each of the first, second and third pixels comprises a first electrode; a second electrode; an organic light-emitting layer disposed between the first electrode and the second electrode, only one color filter selected from a first color filter, a second color filter, and a third color filter and wherein the first, second and third pixel are separated from each adjacent pixel by the pixel defining layers,
   wherein the first pixel comprises the first color filter disposed over the second electrode of the first pixel and configured to transmit light having a first wavelength,
   wherein the second pixel comprises the second color filter disposed over the second electrode of the second pixel and configured to transmit light having a second wavelength,
   wherein the third pixel comprises the third color filter disposed over the second electrode of the third pixel and configured to transmit light having a third wavelength,
   wherein the third pixel comprises a first transmitting region that is located next to the third color filter and in which the third color filter is not disposed,
   wherein the first pixel does not comprise a region in which the first color filter is not disposed; and
   wherein the third color filter is a blue color filter.

2. The display device of claim 1, wherein the second pixel comprises a second transmitting region that is located next to the second color filter,
   wherein when viewed in a direction perpendicular to the major surface, the second transmitting region has an area smaller than that of the first transmitting region.

3. The display device of claim 2, wherein the second color filter is a green color filter.

4. The display device of claim 2, wherein, when viewed in a direction perpendicular to the major surface, a ratio of the area of the first transmitting region to the area of the third color filter is greater than a ratio of the area of the second transmitting region to the area of the second color filter.

5. An organic light-emitting display device comprising:
a substrate;
a pixel defining layer formed on the substrate;
first through third pixels, wherein each of the first through third pixels comprises:
a first electrode; a second electrode; an organic light-emitting layer disposed between the first electrode and the second electrode; and only one color filter material selected from a first color filter material, a second color filter material and a third color filter material,
wherein the first pixel comprises the first color filter material disposed over the second electrode of the first pixel and configured to transmit light having a first wavelength,
wherein the second pixel comprises the second color filter material disposed over the second electrode of the second pixel and configured to transmit light having a second wavelength different from the first wavelength,
wherein the third pixel comprises the third color filter material disposed over the second electrode of the third pixel and configured to transmit light having a third wavelength different from the first and second wavelengths,
wherein the third pixel comprises a first transmitting region in which the third color filter material is not disposed,
wherein the first pixel does not comprise a region in which the first color filter material is not disposed;
wherein the second pixel does not comprise a region in which the second color filter material is not disposed; and
wherein the first, second and third pixel are separated from each adjacent pixel by the pixel defining layer.

6. The display device of claim 5, wherein the first color filter is a red color filter, wherein the second color filter is a green color filter, and wherein the third color filter is a blue color filter.

7. The display device of claim 5, wherein the first wavelength is longer than the second wavelength, and wherein the second wavelength is longer than the third wavelength.

* * * * *